(12) United States Patent  
Lesso

(10) Patent No.: US 7,724,048 B2
(45) Date of Patent: May 25, 2010

(54) LOCKED LOOP CIRCUIT

(75) Inventor: John Paul Lesso, Edinburgh (GB)

(73) Assignee: Wolfson Microelectronics plc, Edinburgh (GB)

(*) Notice: Subject to any disclaimer, the term of this patent is extended or adjusted under 35 U.S.C. 154(b) by 44 days.

(21) Appl. No.: 12/219,075

(22) Filed: Jul. 15, 2008

(65) Prior Publication Data
US 2009/0033376 A1 Feb. 5, 2009

(30) Foreign Application Priority Data
Jul. 31, 2007 (GB) ................................. 0714891.9

(51) Int. Cl.
H03L 7/06 (2006.01)
(52) U.S. Cl. ................. 327/156; 327/147; 327/150; 327/169; 375/376
(58) Field of Classification Search ................. 327/141, 327/144–163; 331/1 A, 15–17; 375/373–376
See application file for complete search history.

(56) References Cited

U.S. PATENT DOCUMENTS

| 5,187,722 | A | 2/1993 | Petty |
| 7,522,011 | B2 * | 4/2009 | Matero et al. ............... 332/128 |
| 2007/0200638 | A1 | 8/2007 | Sander et al. |

* cited by examiner

Primary Examiner—Lincoln Donovan
Assistant Examiner—Brandon S Cole
(74) Attorney, Agent, or Firm—Dickstein Shapiro LLP

(57) ABSTRACT

A circuit for receiving an input signal having a first frequency and generating an output signal having a second frequency. The circuit comprises a forward branch for receiving the input signal and generating the output signal and a return branch for generating a feedback signal from the output signal. The forward branch comprises a frequency detector for receiving the input signal and the feedback signal and outputting a value based on a ratio of a frequency of the feedback signal to the first frequency; a word length reduction block for receiving a fractional component of a first division factor and generating a modulated output; an adder for forming a sum of an integer component of the first division factor and the modulated output of the word length reduction block; a subtracting element for subtracting the output value of the frequency detector from the sum; and an oscillator controlled by an output from the subtracting element.

28 Claims, 3 Drawing Sheets

LOCKED LOOP CIRCUIT

BACKGROUND OF THE INVENTION

1. Field of the Invention

The present invention relates to frequency synthesis, and particularly, but not exclusively, to frequency-locked loops.

2. Description of the Related Art

Frequency-locked loops (FLLS) are blocks that perform the function shown in FIG. 1. That is, an input signal at a fixed first frequency $F_{in}$ is supplied to a FLL 10, and the FLL 10 outputs a signal at a fixed second frequency $F_{out}$ that is not equal to $F_{in}$. This general principle is known as frequency synthesis.

FIG. 2 shows an implementation of a FLL 20. A signal is input to an integrator 22, which outputs a signal to a voltage-controlled oscillator 24 (VCO). The frequency of the output signal from the VCO 24 is controlled by its input signal. A high input signal into the VCO 24 leads to a high-frequency output signal from the VCO 24, and a low input signal into the VCO 24 leads to a low-frequency output signal from the VCO 24. The signal output $F_{out}$ from the VCO 24 is sampled, its frequency divided by a factor N in a ÷N block 26, and the resulting output frequency signal $F_{out}/N$ is fed back to be subtracted from the input signal $F_{in}$ in a subtracting element 27. The difference $\Delta F$ between the frequency of the input signal $F_{in}$ and the feedback signal $F_{out}/N$ is calculated and fed back into the loop. In this way, the system converges to an output signal with a frequency of $F_{out}=N\times F_{in}$.

It is of course desirable for the system to be able to synthesize an output frequency $F_{out}$ which is not an integer multiple of the input frequency $F_{in}$. That is, N need not necessarily be an integer. However, dividing by a fractional number is difficult.

It is advantageous to realize as much of the FLL as possible using digital circuitry, due to the benefits that are inherent with digital signal processing (i.e. cheaper, smaller die area, rapid testability, etc).

SUMMARY OF THE INVENTION

According to a first aspect of the present invention, there is provided a circuit for receiving an input signal having a first frequency and generating an output signal having a second frequency. The circuit comprises a forward branch for receiving the input signal and generating the output signal and a return branch for generating a feedback signal from the output signal. The forward branch comprises a frequency detector for receiving the input signal and the feedback signal and outputting a value based on a ratio of a frequency of the feedback signal to the first frequency; a word length reduction block for receiving a fractional component of a first division factor and generating a modulated output; an adder for forming a sum of an integer component of the first division factor and the modulated output of the word length reduction block; a subtracting element for subtracting the output value of the frequency detector from the sum; and an oscillator controlled by an output from the subtracting element.

According to a second aspect of the present invention, there is provided a method of frequency synthesis. The method comprises the steps of receiving an input signal having a first frequency; receiving a feedback signal; outputting a value based on the ratio between a frequency of the feedback signal and the first frequency; receiving in a word length reduction block a fractional component of a first division factor and generating a modulated output; generating a sum of the modulated output and an integer component of the first division factor; subtracting the value based on the ratio from the sum to generate a difference; and generating an output signal based on the difference, the output signal having a second frequency. The feedback signal is derived from the output signal.

BRIEF DESCRIPTION OF THE DRAWINGS

For a better understanding of the present invention, and to show more clearly how it may be carried into effect, reference will now be made, by way of example, to the following drawings, in which.

DETAILED DESCRIPTION OF THE PREFERRED EMBODIMENT

Figure 3:
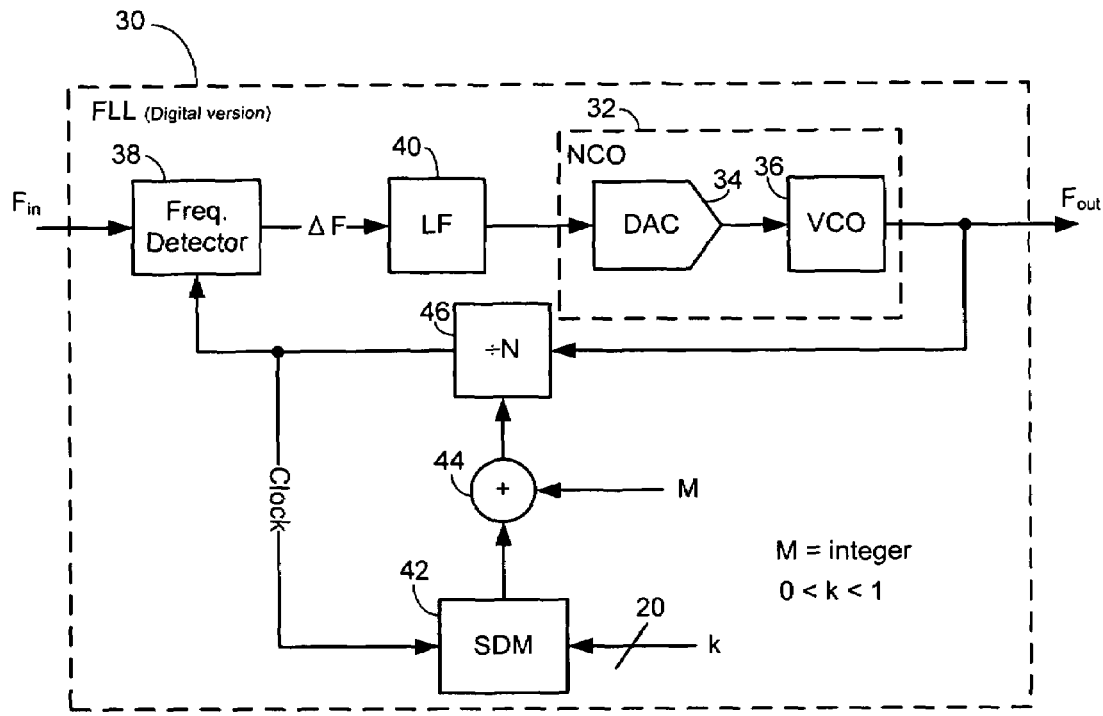
FIG. 3 is a schematic diagram of a digital frequency-locked loop.

FIG. 3 shows an example of a digital FLL 30.

Figure 1:
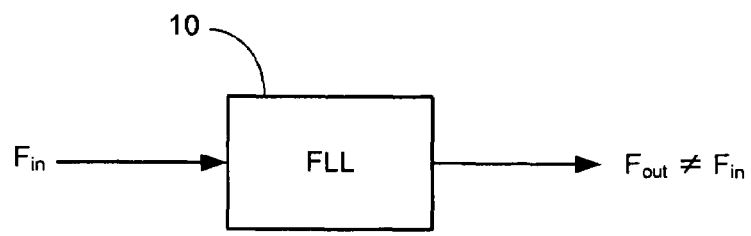
FIG. 1 is a schematic diagram of a frequency-locked loop.
Figure 2:
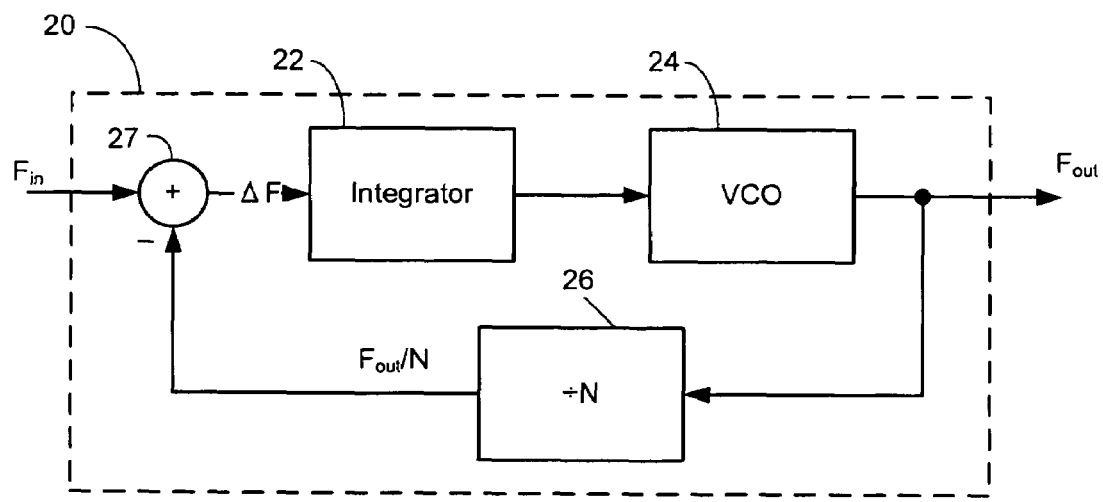
FIG. 2 is a schematic diagram of an analogue frequency-locked loop.

Schematically this is very similar to the analogue loop 20 shown in FIG. 2. The VCO 24 has been replaced with a numerically controlled oscillator 32. In the example shown, the NCO is realized as the combination of a digital-to-analogue converter 34 (DAC) and a VCO 36, but any numerically controlled oscillator may be used.

The input signal having a frequency $F_{in}$ is applied to a frequency detector 38 which outputs a signal representing the frequency difference $\Delta F$ between the input signal and the feedback signal. The value of $\Delta F$ is input to a loop filter 40 with an integrator function, which outputs the integrated signal to the NCO 32.

Fractional division is achieved by combining two numbers, M and k, such that their sum is the overall factor N by which the input frequency is to be multiplied. M is an integer, and k a fractional number between 0 and 1. Typically, k may be very accurately defined, for example of the order of 20 bits.

k is input to a sigma-delta modulator (SDM) 42 which generates a reduced-length output (typically one-bit). The instantaneous output from the SDM 42 may be inaccurate, i.e. a 1 or a 0; however, the average signal output from the SDM 42 is accurate to a high number of bits. The output of the SDM 42 is added to M in an adding element 44, and the sum used to divide the frequency $F_{out}$ of the output signal of the FLL 30 in a ÷N block 46. The output of the ÷N block 46 is also used to clock the SDM 42.

The general principle of fractional division is therefore to divide by integers either side of the desired fractional number, but to weight these such that the average output is accurate. Therefore, the instantaneous frequency output of the ÷N block 46 is very inaccurate—it has a greatly reduced number of bits. However, this causes problems in the frequency detector block 38, as the frequency difference signal is also therefore very inaccurate. The problem is particularly pronounced when N is small, of the order of 5-10, as the percentage of the frequency signal which is discarded is greatest in this case.

For example, take the case where the desired overall division factor N is equal to 8.5. In this case, therefore, M=8 and k=0.5. The output of the SDM 42 will alternate between 1 and 0, so that the average output is 0.5. The ÷N block 46 therefore divides alternately by 8 and 9, and the input to the frequency detector (and therefore the output of the frequency detector) oscillates between two values, neither of which is accurate.

Figure 4:
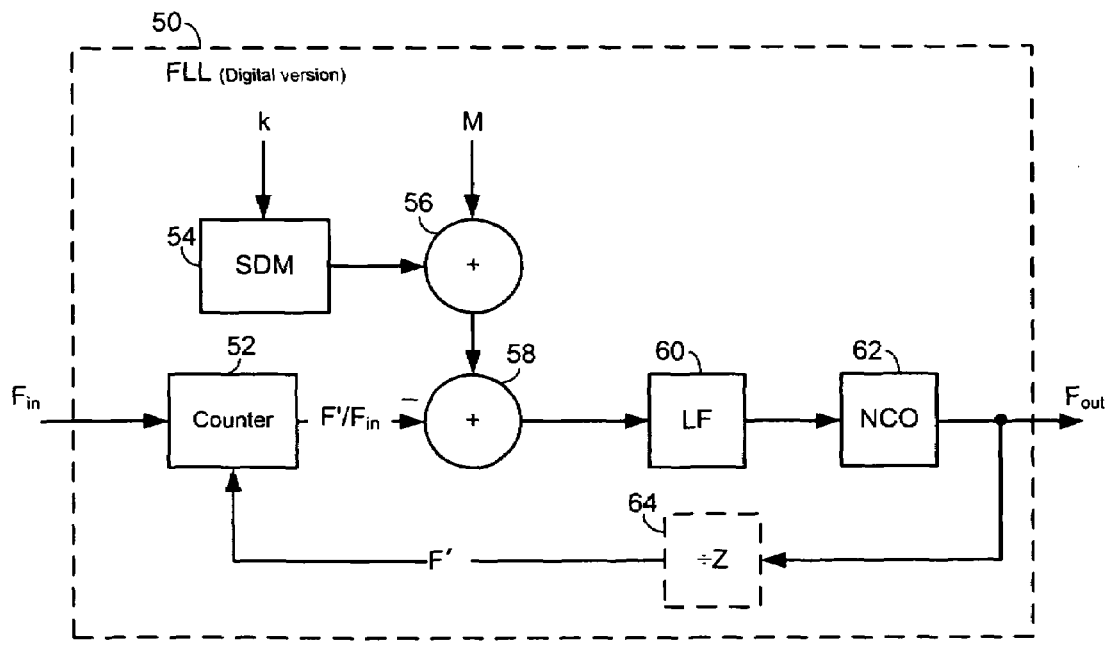
FIG. 4 is a schematic diagram of an alternative frequency-locked loop.

FIG. 4 is a schematic diagram of an alternative frequency-locked loop 50. In this system, rather than providing the fractional divide function in the return branch, it is implemented as part of the forward branch. (The ÷Z block is optional and is only included for practical reasons as will be apparent from the description below. Z will most likely be an integer in any case.)

Figure 5:
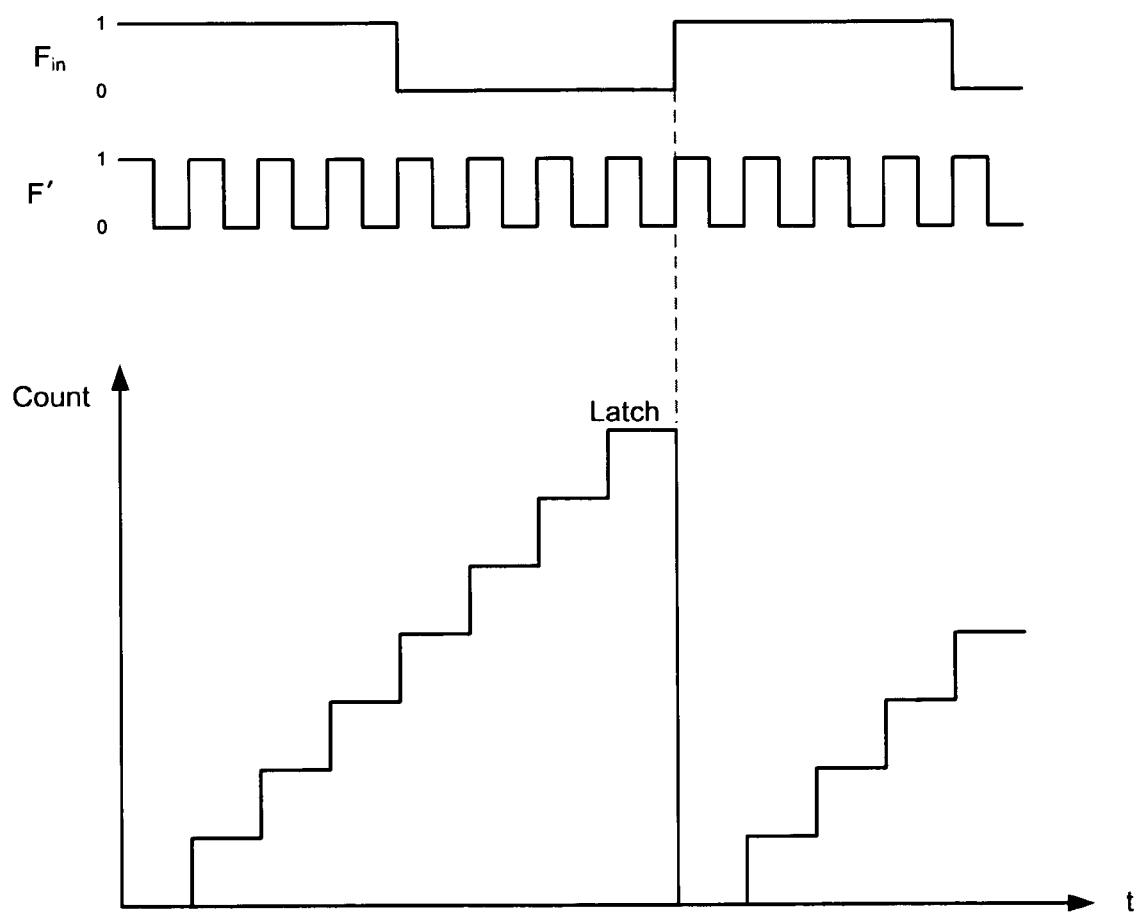
FIG. 5 is a graph showing the operation of the counter in the frequency-locked loop of FIG. 4.

The signal of frequency $F_{in}$ is input to a ratio detector 52, together with the signal, of frequency F', derived from the output signal. The ratio detector 52 outputs a signal which is the ratio of the two frequencies $F_{in}$ and F'. An example of how this is achieved is shown in FIG. 5.

The fractional division factor is now input to the system. As before, the overall factor N is divided into two components, an integer component M and a fractional component k, which may be accurately defined in a high number of bits. The component k is fed to a SDM 54, which quantizes k as either 1 or 0 but with an average value which is accurate. This is added to the integer component M in an adding element 56, and the ratio of the frequencies subtracted from the sum in a subtracting element 58. Thus if the FLL 50 is synthesizing the output frequency as desired, the average output of the subtracting element 58 will be zero. The output of the subtracting element 58 is then fed to a loop filter 60 (alternatively any block with an integrating function can be used), and the output of the loop filter 60 used to control a NCO 62.

Optionally, in the case where the NCO 62 comprises a DAC followed by a VCO, there may be a capacitor (not illustrated) connected at one terminal between the DAC and the VCO, and at the other terminal coupled to ground, in order to provide a low-pass filtering effect. Alternatively an RC network may be used to provide the low-pass filtering effect.

Alternatively, the SDM 54 could be any word length reduction block that functions to reduce the number of bits of the fractional component k. For example, a truncation block or a noise shaper could be used, and any of these components could be used with or without dither to improve the accuracy of the reduced word length output.

FIG. 5 is a graph showing one possible mode of operation of the ratio detector 52, in which the ratio detector 52 is realised as a counter. The graph shows the input signal at frequency $F_{in}$ at the top, and the signal at F' below it. The ratio detector 52 is designed to count on each positive edge of the F' signal, and to reset the count on each positive edge of the $F_{in}$ signal. The output of the ratio detector 52 is latched so that only the highest count is taken before it is reset. Thus, the output of the ratio detector 52 is the number of periods of the F' signal in one period of the $F_{in}$ signal, i.e. the ratio of the two frequencies.

Alternative solutions to the ratio detector 52 may be thought of by a person skilled in the art without departing from the scope of the present invention. For example, negative edges could be employed to count rather than positive edges, or both positive and negative edges could be employed.

An advantage of the FLL 50 of FIG. 4 is that the "resolution" of the system is not thrown away until after the frequency detecting stage. That is, the current performance of the FLL, as determined by the ratio of $F_{out}$ to $F_{in}$, is accurately measured and used to adapt the output of the system. The benefit of the FLL 50 is that the greater the frequency F' the better the signal-to-noise ratio (SNR). In the FLL 30 of FIG. 3, the performance of the system is inaccurately determined due to the quantizing nature of the SDM 42 in the return branch.

Optionally, a further division may be performed in the return loop (÷Z block 64 in FIG. 4). This may be introduced in certain applications for practical reasons, as the ratio of the frequencies $F_{in}$ and $F_{out}$ may be too high for a particular application. A high frequency ratio will mean the counter 52 also needs to be very large. To reduce this problem, the return frequency $F_{out}$ may be divided to reduce the ratio that the counter has to count and therefore reduce the size of the counter. Although dividing the output frequency also reduces the resolution of the frequency detect stage (i.e. the counter 52), a compromise is reached between reducing the size of the counter 52 and reducing the resolution of the detected frequency ratio.

If the ÷Z block 64 is not included, $F'=F_{out}$. If the ÷Z block 64 is included, $F'=F_{out}/Z$. Therefore, in the case where the ÷Z block 64 is provided, the components M and k will be chosen not to sum to the overall factor N, but to sum to N/Z. That is, $F'=F_{out}/Z$, and therefore $F'/F_{in}=N/Z$.

The frequency-locked loop 50 is preferably incorporated in an integrated circuit. For example, the integrated circuit may be part of an audio and/or video system, such as an MP3 player, a mobile phone, a camera or a satellite navigation system, and the system can be portable (such as a battery-powered handheld system) or can be mains-powered (such as a hi-fi system or a television receiver) or can be an in-car, in-train, or in-plane entertainment system.

The skilled person will recognise that the above-described apparatus and methods may be embodied as processor control code, for example on a carrier medium such as a disk, CD- or DVD-ROM, programmed memory such as read only memory (firmware), or on a data carrier such as an optical or electrical signal carrier. For many applications, embodiments of the invention will be implemented on a DSP (digital signal processor), ASIC (application specific integrated circuit) or FPGA (field programmable gate array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (very high speed integrated circuit hardware description language). As the skilled person will appreciate, the code may be distributed between a plurality of coupled components in communication with one another. Where appropriate, the embodiments may also be implemented using code running on a field-(re-)programmable analogue array or similar device in order to configure analogue/digital hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

What is claimed is:

1. A circuit for receiving an input signal having a first frequency and generating an output signal having a second frequency, the circuit comprising:
   a forward branch for receiving the input signal and generating the output signal; and
   a return branch for generating a feedback signal from the output signal;

wherein the forward branch comprises:
a frequency detector for receiving the input signal and the feedback signal and outputting a value based on a ratio of a frequency of the feedback signal to the first frequency;
a word length reduction block for receiving a fractional component of a first division factor and generating a modulated output;
an adder for forming a sum of an integer component of the first division factor and the modulated output of the word length reduction block;
a subtracting element for subtracting said output value of the frequency detector from said sum; and
an oscillator controlled by an output from the subtracting element.

2. A circuit as claimed in claim 1, wherein the word length reduction block is adapted to generate a sequence of one-bit values, having an average value equal to the fractional component of the first division factor.

3. A circuit as claimed in claim 1, wherein the word length reduction block comprises a truncation block.

4. A circuit as claimed in claim 1, wherein the word length reduction block comprises a sigma-delta modulator.

5. A circuit as claimed in claim 1, wherein the word length reduction block comprises a noise shaper.

6. A circuit as claimed in claim 1, wherein the frequency detector comprises a counter, for counting a number of cycles of the feedback signal during each cycle of the input signal, and for outputting the counted number as the value based on the ratio of the frequency of the feedback signal to the first frequency.

7. A circuit as claimed in claim 1, wherein the oscillator is a numerically controlled oscillator.

8. A circuit as claimed in claim 7, wherein the numerically controlled oscillator comprises a digital-to-analogue converter and a voltage controlled oscillator.

9. A circuit as claimed in claim 1, wherein the forward branch further comprises a low-pass filter, connected to receive the output from the subtracting element and to supply a filtered output to the oscillator.

10. A circuit as claimed in claim 1, wherein the feedback signal is the output signal, and the first division factor is equal to a ratio of the second frequency to the first frequency.

11. A circuit as claimed in claim 1, wherein the return branch comprises a frequency divider such that the feedback signal has a third frequency, wherein the third frequency is equal to the second frequency divided by a second division factor, and a product of the first and second division factors is equal to a ratio of the second frequency to the first frequency.

12. A circuit as claimed in claim 11, wherein the second division factor is an integer.

13. An integrated circuit, comprising a circuit as claimed in claim 1.

14. An audio system, comprising an integrated circuit as claimed in claim 13.

15. An audio system as claimed in claim 14, wherein the audio system is a portable device.

16. An audio system as claimed in claim 14, wherein the audio system is a mains-powered device.

17. An audio system as claimed in claim 14, wherein the audio system is an in-car, in-train, or in-plane entertainment system.

18. A video system, comprising an integrated circuit as claimed in claim 13.

19. A video system as claimed in claim 18, wherein the video system is a portable device.

20. A video system as claimed in claim 18, wherein the video system is a mains-powered device.

21. A video system as claimed in claim 18, wherein the video system is an in-car, in-train, or in-plane entertainment system.

22. A method of frequency synthesis, the method comprising:
receiving an input signal having a first frequency;
receiving a feedback signal;
outputting a value based on the ratio between a frequency of the feedback signal and the first frequency;
receiving in a word length reduction block a fractional component of a first division factor and generating a modulated output;
generating a sum of said modulated output and an integer component of said first division factor;
subtracting said value based on the ratio from said sum to generate a difference; and
generating an output signal based on said difference, the output signal having a second frequency;
wherein said feedback signal is derived from said output signal.

23. A method as claimed in claim 22, wherein the word length reduction block generates a sequence of one-bit values, having an average value equal to the fractional component of the first division factor.

24. A method as claimed in claim 22 or 23, wherein said outputting step comprises:
counting a number of cycles of the feedback signal during each cycle of the input signal; and
outputting the counted number as the value based on the ratio of the frequency of the feedback signal to the first frequency.

25. A method as claimed in claim 22, further comprising:
low-pass filtering the difference before generating said output signal.

26. A method as claimed in claim 22, wherein the feedback signal is the output signal, and the first division factor is equal to a ratio of the second frequency to the first frequency.

27. A method as claimed in claim 22, wherein the feedback signal is derived by:
taking the output signal;
dividing the second frequency by a second division factor to generate the feedback signal, the feedback signal having a third frequency being equal to the second frequency divided by the second division factor,
wherein a product of the first and second division factors is equal to a ratio of the second frequency to the first frequency.

28. A method as claimed in claim 27, wherein the second division factor is an integer.

* * * * *